United States Patent [19]

Fischbeck

[11] 4,115,789

[45] Sep. 19, 1978

[54] SEPARABLE LIQUID DROPLET INSTRUMENT AND PIEZOELECTRIC DRIVERS THEREFOR

[75] Inventor: Kenneth H. Fischbeck, Dallas, Tex.

[73] Assignee: Xerox Corporation, Stamford, Conn.

[21] Appl. No.: 768,664

[22] Filed: Feb. 14, 1977

Related U.S. Application Data

[63] Continuation of Ser. No. 649,381, Jan. 15, 1976, abandoned.

[51] Int. Cl.$^{2}$ .................... G01D 15/18; H01L 41/10

[52] U.S. Cl. .................... 346/140 R; 310/328

[58] Field of Search .................... 346/75, 140; 310/328, 310/330

[56] References Cited

U.S. PATENT DOCUMENTS

| | | | |
|---|---|---|---|
| 3,747,120 | 7/1973 | Stemme | 346/75 |
| 3,848,118 | 11/1974 | Rittberg | 346/75 X |
| 3,852,773 | 12/1974 | Sicking et al. | 346/140 |
| 3,864,685 | 2/1975 | Fischbeck | 346/140 |
| 3,930,260 | 12/1975 | Sicking | 346/140 |
| 4,057,807 | 11/1977 | Fischbeck et al. | 346/140 R |

FOREIGN PATENT DOCUMENTS

| | | | |
|---|---|---|---|
| 2,256,667 | 6/1974 | Fed. Rep. of Germany | 346/75 |

*Primary Examiner*—George H. Miller, Jr.

[57] ABSTRACT

An ink jet assembly comprises a piezoelectric driver and a liquid droplet instrument. The driver includes a plurality of piezoelectric members, which may be selectively energized. The instrument includes an elastic diaphragm means, which forms an outer wall of each of a plurality of chambers. The piezoelectric members are in operative engagement with the wall means to normally place a stress on the wall tending to decrease the volume of each chamber. When a piezoelectric member is actuated, the corresponding wall means deforms to decrease the volume of its particular chamber to increase the pressure therein to express a liquid droplet therefrom. The driver and instrument are releasably secured to each other to permit replacement of the instrument without disposing the driver.

11 Claims, 8 Drawing Figures

FIG. 1
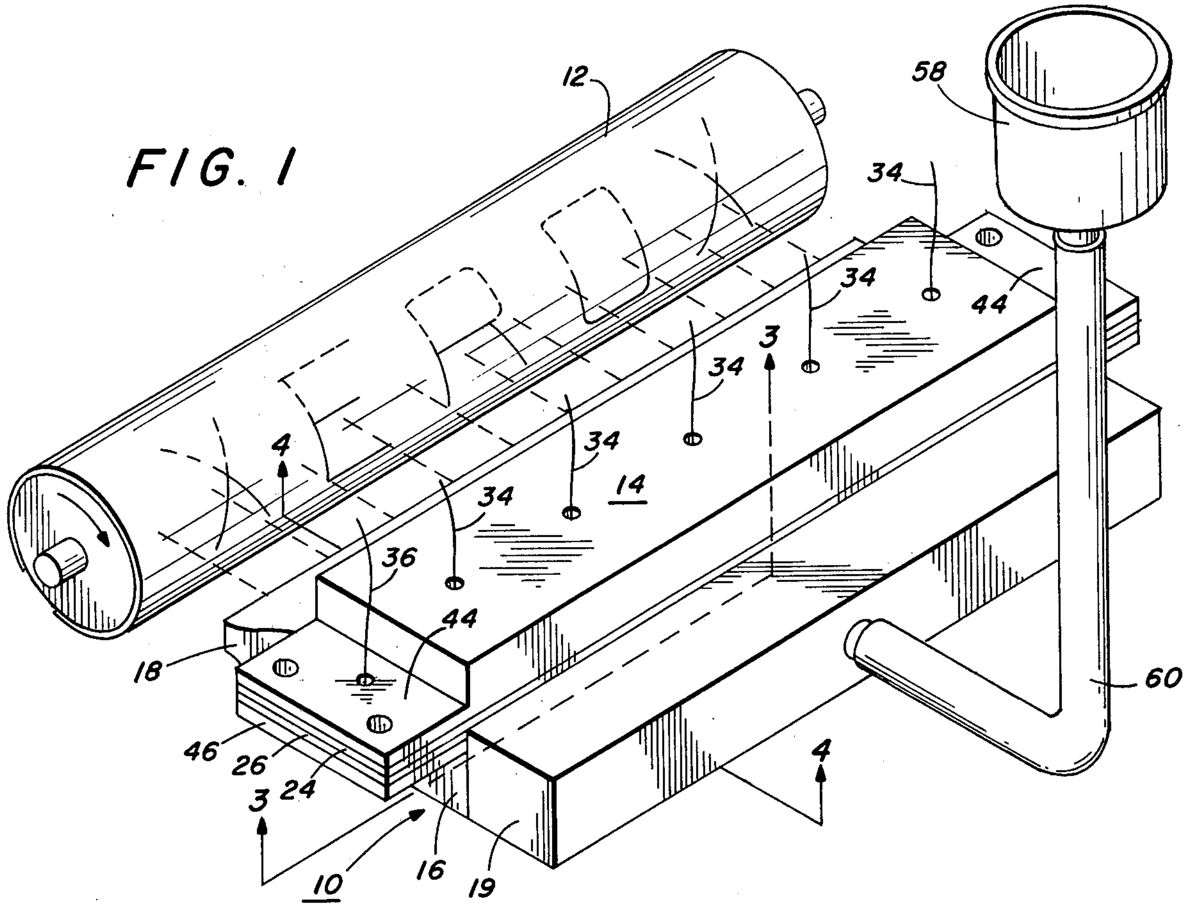
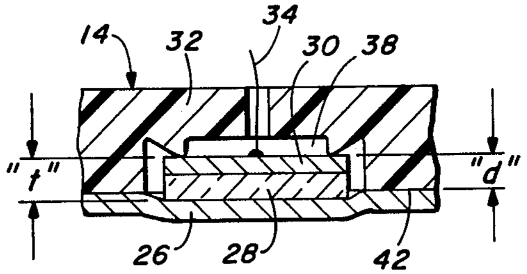
FIG. 2
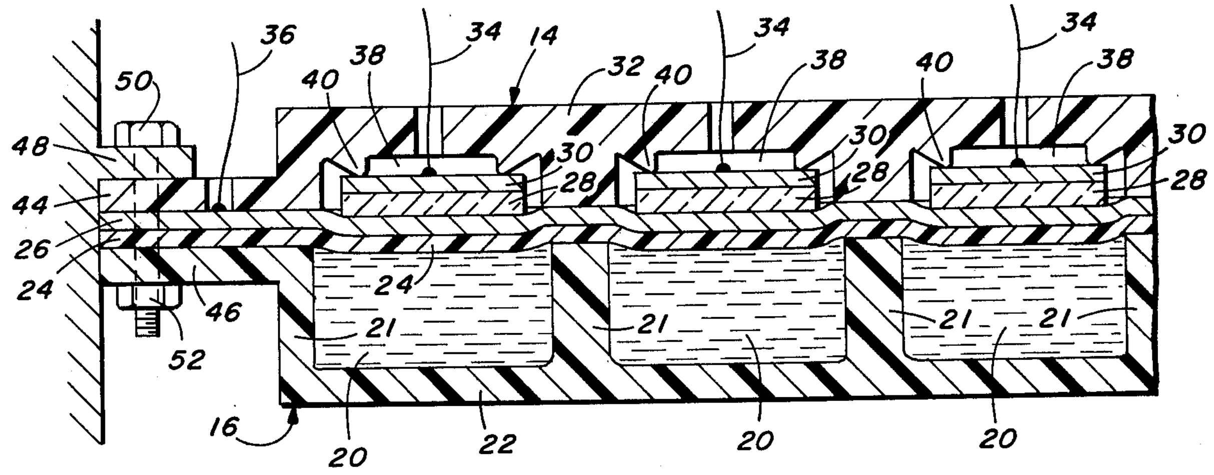
FIG. 3

FIG. 4
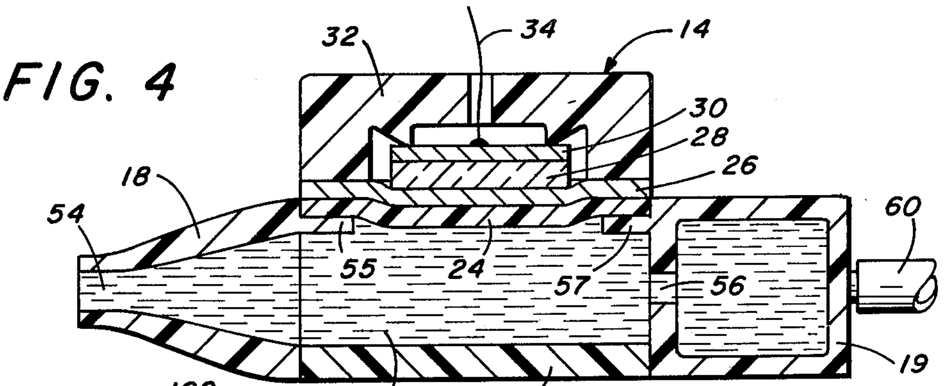
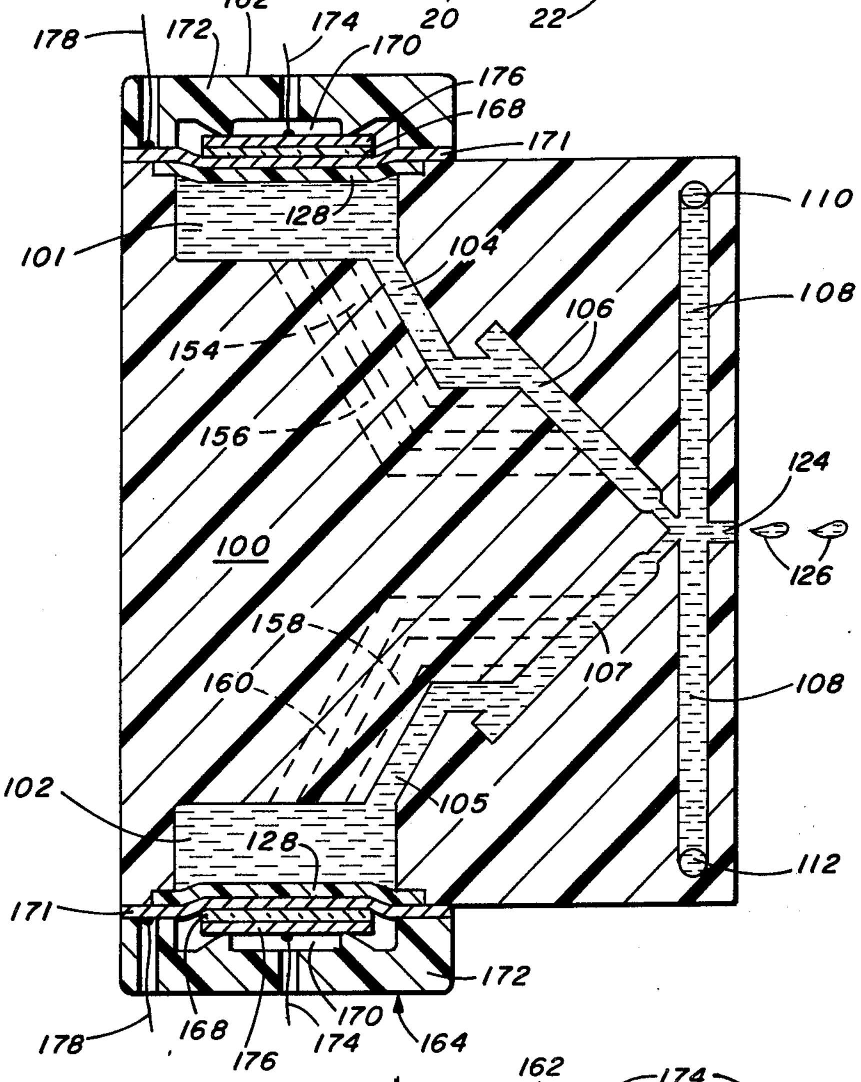
FIG. 7
FIG. 8
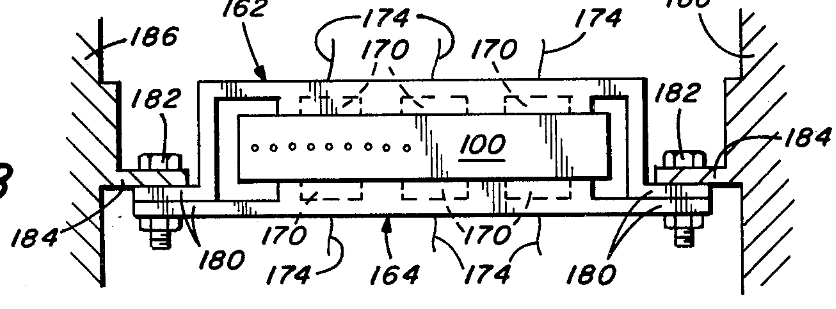

SEPARABLE LIQUID DROPLET INSTRUMENT AND PIEZOELECTRIC DRIVERS THEREFOR

DESCRIPTION OF THE INVENTION

This application is a continuation of U.S. application Ser. No. 649,381, filed Jan. 15, 1976, now abandoned.

In an ink jet assembly wherein ink droplets are expressed from a chamber by selectively increasing the pressure therein, the means for increasing the pressure in the chamber may be piezoelectric or magnetostrictive actuators. The actuators are normally permanently secured to the ink jet assembly requiring new actuators each time an assembly must be replaced. The actuators comprise a substantial proportion of the cost of the assembly. Therefore, if the actuators are reusable so they may be used with replacement assemblies, a substantial savings can be achieved.

It is, therefore, an object of this invention to provide an ink jet assembly, wherein piezoelectric driver means are releasably attached to a liquid droplet expression instrument so the instrument can be replaced with a new instrument while still employing the same piezoelectric drivers.

It is a further object to provide a simply constructed liquid droplet expression instrument, which is releasably secured to piezoelectric driver means.

It is yet a further object of this invention to construct an assembly in accordance with the above objects, which is specifically adapted for ink jet applications.

Other objects of the invention will become apparent from the following description with reference to the drawings wherein:

FIG. 1 is a perspective view of a multiple ink jet printing system;

FIG. 2 is a section view of a portion of a piezoelectric driver bar;

FIG. 3 is a view taken along section line 3—3 of FIG. 1;

FIG. 4 is a view taken along section line 4—4 of FIG. 1;

FIG. 7 is a view taken along section line 7—7 of FIG. 5 and

FIG. 8 is a front view of the unit of FIGS. 5-7 illustrating piezoelectric drivers releasably attached thereto.

Figure 5:
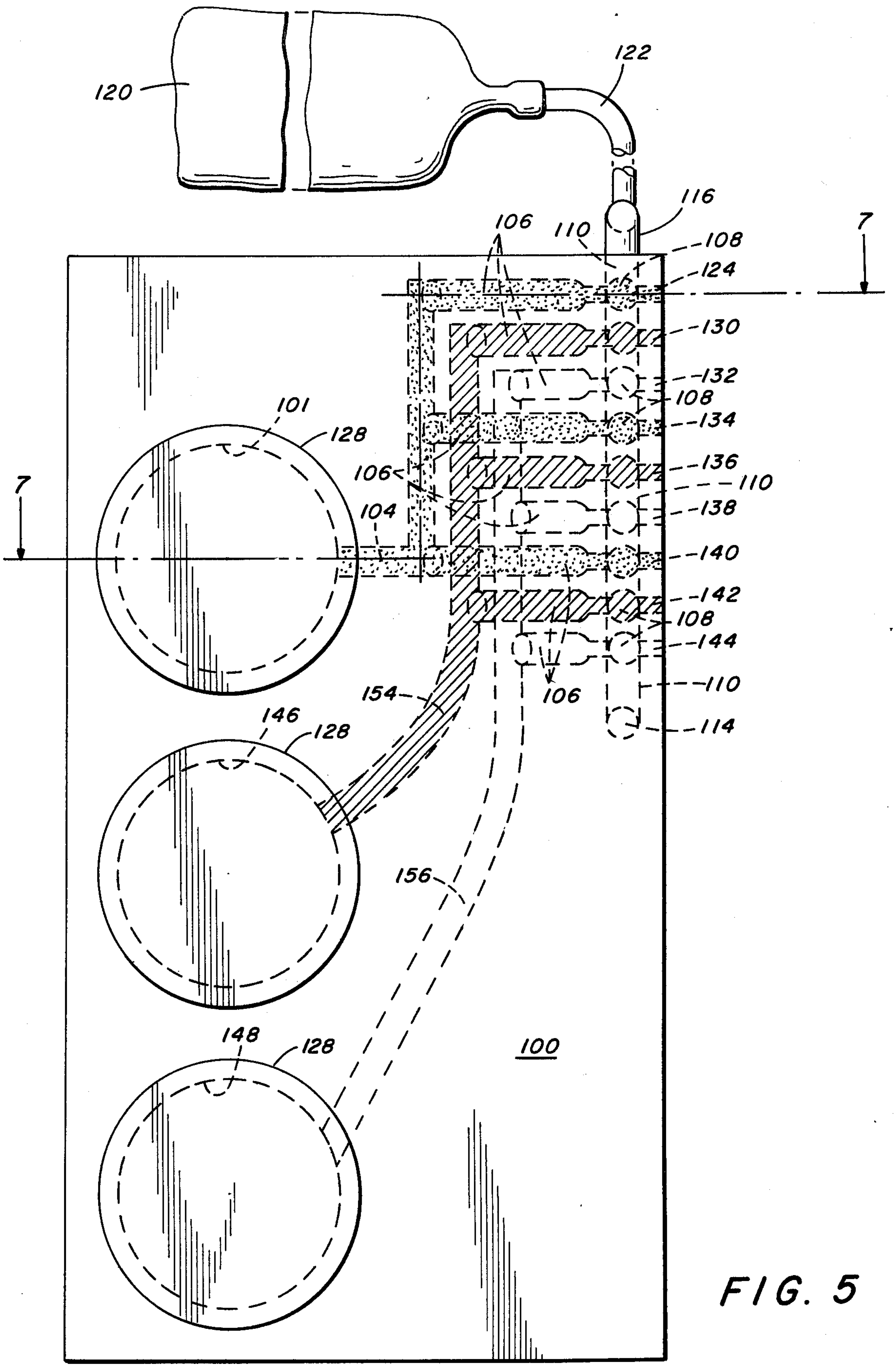
FIG. 5 is a top view of a coincidence ink jet unit.

Referring to FIGS. 1-4, a multiple ink jet assembly is arranged opposite a rotating recording medium 12 for depositing ink droplets thereon. The assembly comprises a driver unit 14 releasably secured to an ink jet instrument unit 10. The instrument 10 comprises an elongated plastic or ceramic chamber unit 16, a plastic or ceramic multiple nozzle unit 18 attached to the front of the chamber unit 16 and a plastic or ceramic manifold reservoir unit 19 attached to the rear of the chamber unit. The chamber unit has a plurality of rectangularly shaped chambers 20 separated by side walls 21 projecting upwards from a bottom wall 22. An elastic thin diaphragm 24 spans the chamber body and is sealed to the upper edge of each wall 22 to form an outer wall of the chamber body. The elastic diaphragm 24 comprises an elastic material, such as stainless steel, glass or nickel.

The driver unit 14 includes a plurality of transducer members comprising an electrically conductive elastic metallic web 26 and a plurality of longitudinally spaced piezoelectric ceramic members 28 bonded to the web 26. A plurality of electrodes 30 are bonded to a respective one of the piezoelectric members 28 and a ceramic or plastic carrier bar 32. The piezoelectric members 28 and the electrodes 30 are circular in the preferred mode but may be square or rectangular. The piezoelectric member 28 is polarized during the manufacture thereof to contract in a radial direction. A plurality of electrical leads 34 are each connected to a respective electrode 30 and an electrical lead 36 is connected to the web 26. The leads 34 and 36 are connected to electrical drivers (not shown) so that the electrode 30 for each piezoelectric member may be separately addressed. The carrier bar 32 includes a plurality of cylindrical cavities 38, each of which has a ridge 40 on the closed end wall 41 thereof. The ridge 40 circumscribes a circle on the wall 41. The surface of the ridge is located a distance "*d*" from the face 42 of the carrier bar 32, which is less than the combined thickness "*t*" of the piezoelectric member 28 and electrode 30. The metal web 26 is bonded by any well-known adhesive to the portions of the face 42 of the carrier bar, which are located between the cavities 38 in such a manner to press the electrode 30 into engagement with the ridge 40. Due to the difference in the combined thickness "*t*" of the piezoelectric member 28 and electrode 30 and the distance "*d*" between the face 42 and the ridge 40, the web 26 will be slightly deformed when the web 26 is bonded to the carrier bar 32.

A flange 44 is provided on each longitudinal end of the carrier bar 14, and a complementary flange 46 is provided on each longitudinal end of the chamber housing. The carrier bar 14 and the chamber housing 16 are assembled together and attached to longitudinally spaced support flanges 48 (only one shown), located adjacent each longitudinal end thereof, by a bolt 50 and nut 52 assembly. The degree of deformation of the web 26, due to the protrusion of the piezoelectric member 28 beyond the face 42, is such that the diaphragm 24 will be slightly stressed when carrier bar 14 and the chamber housing 16 are assembled together to assure that the diaphragm wall 24 conforms to the shape of the deformed web 26 in a normal position. Upon applying a voltage across the piezoelectric member 28, the piezoelectric member 28 will deform causing the diaphragm 24 to similarly deform to decrease the volume of the chamber 20 to express an ink droplet therefrom. Upon termination of the voltage application, the diaphragm 24 returns to its normal position due to the elasticity thereof to restore the liquid volume of the chamber 20.

The multiple nozzle unit 18 is of thin plastic wall construction and comprises a plurality of ink jet droplet orifices 54 separated by a wall therebetween. The nozzle unit has a plurality of spaced ledges 55 which are sealed to the front portion of the diaphragm 24. The nozzle unit is also sealed to the walls 21 and the bottom wall 22 with one orifice being communicated with one chamber.

The manifold ink reservoir unit 19 is also of thin plastic wall construction and has a plurality of spaced ledges 57 which are sealed to the back edge of the diaphragm 24. The reservoir unit is also sealed to the walls 21 and the bottom wall 22 and is communicated to the individual chambers 20 through a plurality of orifices 56. The reservoir orifice 56 is more restrictive to flow from the chamber than the droplet orifice 54 whereupon pressure developed in the chamber 20, due to deformation of the diaphragm 24, will express a droplet from the nozzle orifice 54 rather than force fluid back to the reservoir through orifice 56. Upon relaxation of the diaphragm, fluid from the reservoir will replace the ink expressed from chamber 20. A primary reservoir 58 supplies the manifold reservoir through a conduit 60 and may be kept at a pressure of about 6 inches of liquid.

In operation, a voltage is selectively applied to the piezoelectric member 28 of various selected chambers to cause deformation of the diaphragm 24 thereat to express ink droplets from the nozzle orifice 54 associated therewith. Ink droplets will be deposited on the recording medium, in accordance with a desired image, as the recording medium 12 rotates past the ink jet assembly unit 2.

When it is desired to replace the instrument 10, the assembly 2 is removed from the support flange 48, the instrument 10 replaced and the assembly of the new instrument and old driver unit secured to the support flange 48. The piezoelectric members are usable with a number of ink jet assemblies saving the cost of providing new piezoelectric members for each new assembly.

Figure 6:
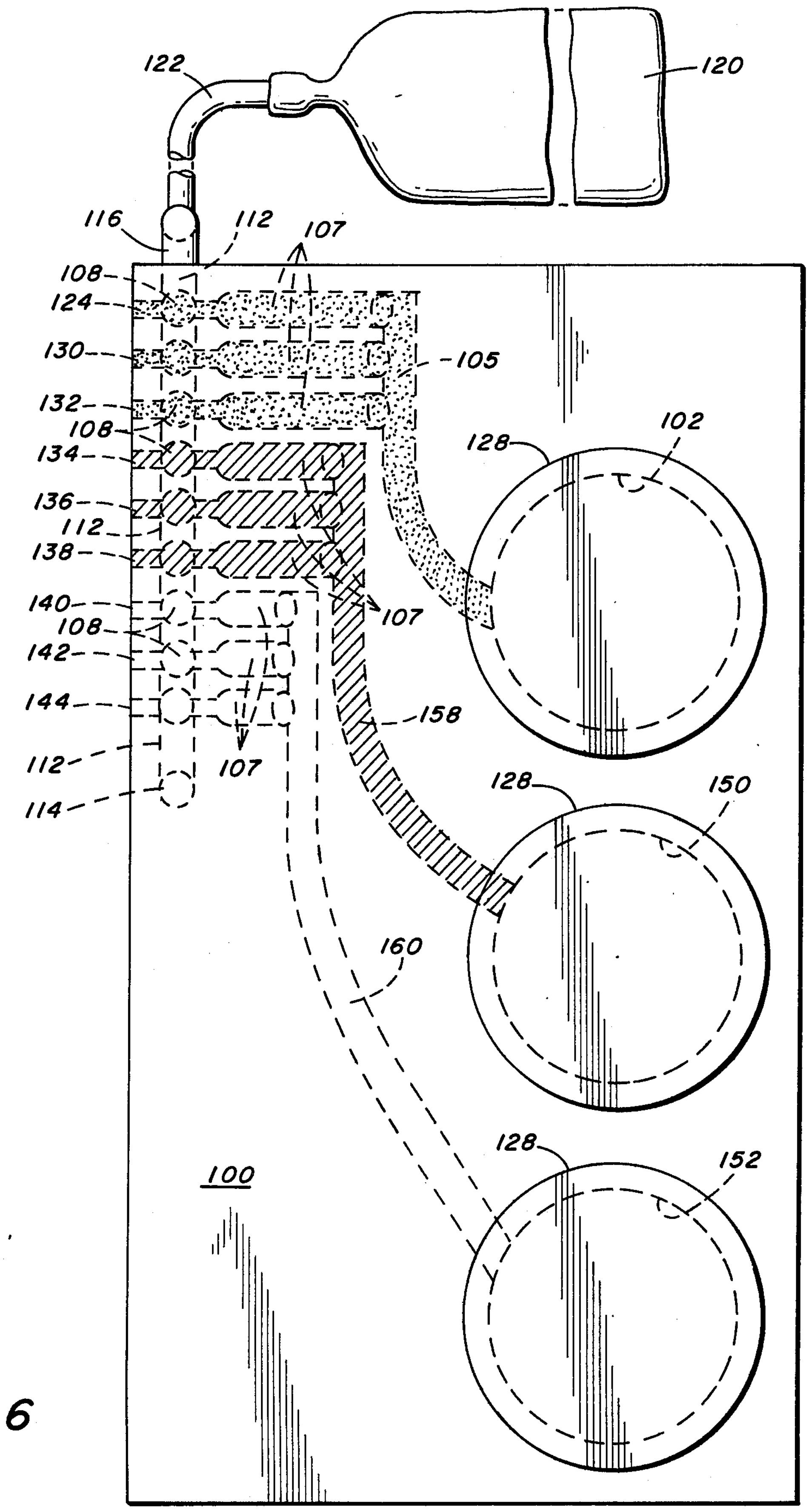
FIG. 6 is a bottom view of a coincident ink jet unit of FIG. 5.

Referring to FIGS. 5–7, there is illustrated a coincidence ink jet assembly to which the principle of this invention may also apply. A coincidence jet assembly is the subject matter of copending U.S. application, Ser. No. 625,988, filed Oct. 22, 1975, and entitled "Coincidence Ink Jet", (common assignee), and comprises two liquid ink pressure passages and a droplet outlet orifice. Each of the pressure passages is communicated to a respective pressure chamber. An ink droplet is expressed from the outlet orifice only when the liquid in both the pressure passages has a simultaneous increase in pressure.

Referring to FIG. 7, there is illustrated a section view of an ink jet instrument housing 100, which includes a pair of circular pressure chambers 101 and 102. Main fluid pressure passages 104 and 105 lead from the chambers 101, 102, respectively, to pressure inlet passages 106, 107, which lead to a liquid ink supply passage 108 where the three passages intersect. The liquid ink supply passage 108 branches off from two parallel main supply passages 110 and 112, which, in turn, are joined at one end inside the housing by a cross-passage 114 and at the other end by an external C-shaped tubular fitting 116. A flexible bag ink reservoir 120 is communicated to the tubular fitting 116 by a conduit 122. Also, at the intersection is an outlet orifice 124 through which ink droplets 126 are expressed onto a copy medium.

The chambers 101 and 102 are each sealed by a respective elastic diaphragm 128, which is secured to the housing 100 by a suitable adhesive. The chambers and passages are entirely filled with liquid. When the diaphragm 128 for either chamber 101 or 102 is deformed, a pressure increase will occur in that particular chamber causing displacement of ink in a respective one of passages 106 and 107.

The relationship between the above described chambers, passages and the droplet outlet orifice is now described for an understanding of a coincidence ink jet principle. The passages 106 and 107 are at such an angle relative to the orifice 124, the impedance to liquid flow in passage 108 relative to the impedance to liquid flow in orifice 124, and the magnitude and duration of a pressure increase exerted on the liquid in the pressure chambers 101, 102 are designed that the ink stream expressed from only one passage at a time will entirely miss orifice 124 and displace the ink in the ink supply passage 108, while the ink within orifice 124 will not be disturbed to the extent of expressing a droplet therethrough. The orifice 124 is so located relative to the intersection of the passages 106, 107 and the magnitude and duration of the pressure increase exerted on the liquid in the pressure chambers 101, 102 are so designed that the summation vector of the fluid momentum vectors in passages 106 and 107 will lie on the axis of the orifice 124. Thus, only when the diaphragm 128 for both pressure chambers 101, 102 is simultaneously deformed, thereby applying a simultaneous pressure increase in the liquid in each of passages 106, 107, will an ink droplet 126 be expressed from orifice 124.

The aforedescribed coincidence ink jet principle has specific utilization in a matrix actuation system where a large number of jets or a dense linear jet array is employed since substantially fewer pressure chambers than the number of jets utilized are required. Theoretically, since two independent pressure chambers are required to effect expression of an ink droplet through a jet, the number of pressure chambers required in a matrix actuation system is twice the square root of the number of jets. For example, theoretically, only 120 pressure chambers are needed for 3600 jets. Each jet orifice is communicated to two pressure chambers. However, as the number of jets increases in a system, the number of jets communicated to one pressure chamber will be hydraulically limited and, therefore, more pressure chambers may be required. For instance, the practical number of pressure chambers for a 3600-jet instrument may range between 120 and 400. In this instance, a housing would be provided with a plurality of pressure chambers, each serving a number of ink jets. The embodiment of FIGS. 5–7 illustrates a nine-jet, six-pressure chamber ink jet instrument. Each orifice 130, 132, 134, 136, 138, 140, 142 and 144 has pressure inlet passages 106, 107 and a fluid supply passage 108 communicated to it in exactly the same manner as described for orifice 124. The pressure chambers 146, 148, 150 and 152 are the same as chambers 101 and 102 and each is sealed by separate diaphragms 128. For clarity, FIG. 5 illustrates fluid passages between only the chambers 101, 146 and 148 and their respective ink jet orifices; and FIG. 6 illustrates the fluid passages between only the chambers 102, 150 and 152 and their respective ink jet orifices. Also, some of the passages are crosshatched and filled with dots for clarity in showing separate passages. Chamber 101 is communicated to the jets 124, 134 and 140 by main passage 104; chamber 146 is communicated to the jets 130, 136 and 142 by passage 154; and chamber 148 is communicated to jets 132, 138 and 142 by passage 156. Chamber 102 is communicated to jets 124, 130 and 132 by passage 105; chamber 150 is communicated to jets 134, 136 and 138 by passage 158; and chamber 152 is communicated to jets 140, 142 and 144 by passage 160. The following table shows which jets express droplets therefrom when particular chambers are pressurized:

| Chambers Simultaneously Pressurized | Droplet Expressed From Jet |
|---|---|
| 102, 101 | 124 |
| 102, 146 | 130 |
| 102, 148 | 132 |
| 150, 101 | 134 |
| 150, 146 | 136 |
| 150, 148 | 138 |
| 152, 101 | 140 |
| 152, 146 | 142 |
| 152, 148 | 144 |

Referring to FIGS. 7 and 8, a pair of driver units 162, 164 is removably secured to a stationary support 166. Each driver unit is constructed in the same manner as driver unit 14 with a piezoelectric member 168 for each chamber disposed in a respective cavity 170 of a carrier bar 172. An elastic metallic web 171 is bonded to each piezoelectric member and the carrier bar 172 and engages each diaphragm 128 to exert a slight stress thereon. Electrically insulated lead wires 174 are connected to a respective thin electrically conductive metallic plate 176 bonded to the piezoelectric member 168. An electrically insulated lead 178 is connected to the web 171. A plurality of electronic drivers are electrically connected to a respective one of lead wires 174 and 178 to selectively apply a voltage across a selected piezoelectric member 168. When an ink droplet is desired through a particular orifice, a voltage is applied across the piezoelectric members corresponding to the particular two chambers which need to be pressurized to express a droplet through such orifice. When a voltage is applied to a piezoelectric member, deformation of the piezoelectric member will cause the diaphragm 128 to deform resulting in decreasing the volume of its respective pressure chamber and increasing the pressure therein. The liquid droplet instrument is sandwiched between the driver units 162 and 164, which have flanges 180 at the longitudinal ends thereof. A bolt 182 extends through the flanges and a support flange 184 to secure the ink jet assembly to a stationary support structure 186. When it is desired to replace the ink jet instrument with a new one, the drivers 162 and 164 are removed from the support flange 184, housing 100 removed and replaced with a new one and the drivers resecured to the support flange 184. Thus, the piezoelectric members are usable with a number of ink jet instruments saving the cost of providing new piezoelectric members for each new instrument.

The diaphragm 24 for the embodiment of FIGS. 1–4 spans the entire chamber housing. There may be substituted therefor a plurality of diaphragms, one for each chamber. Similarly, a continuous diaphragm web may span the housing 100 to seal chambers 101, 146 and 148 and another continuous diaphragm web may seal the chambers 102, 150 and 152 rather than employing separate diaphragms 128 for each chamber of the embodiment of FIGS. 5–8.

What is claimed is:

1. In a liquid drop generator comprising: a housing having a plurality of pressure chambers therein, said pressure chambers opening onto an outer surface of said housing; elastic diaphragm means sealing each chamber opening thereby forming an outer wall of a respective chamber; driver unit means releasably secured to said housing, said driver unit means comprising a carrier member and a plurality of transducer means operatively secured to said carrier member; said transducer means comprising a plurality of piezoelectric members and elastic means operatively secured to each said piezoelectric member for deforming therewith, the portion of said transducer elastic means corresponding to each said piezoelectric members operatively engaging said diaphragm means of a respective one of said chambers in such a manner to normally exert a stress on said diaphragm means tending to decrease the volume of a respective said chamber; and means for applying a voltage across said piezoelectric members to deform the same and thereby their respective said transducer elastic means and diaphragm means for decreasing the volume of their respective said chambers.

2. The structure as recited in claim 1 wherein said diaphragm means comprises a plurality of separate diaphragm members, one for each chamber.

3. The structure as recited in claim 1 wherein said diaphragm means is a web spanning said chambers.

4. The structure as recited in claim 1 wherein all of said pressure chambers open onto only one surface of said housing, and said driver unit means is located opposite said one surface.

5. The structure as recited in claim 4 further comprising a plurality of droplet outlet orifices, each communicated with a respective one of said pressure chambers.

6. The structure as recited in claim 1 wherein a group of said pressure chambers opens onto one surface of said housing, and another group of said pressure chambers opens onto another surface of said housing; a portion of said driver unit means being located opposite said one surface of said housing, and another portion of said driver unit means being located opposite said another surface of said housing.

7. The structure as recited in claim 5 further comprising a plurality of droplet outlet orifices, each of said pressure chambers being communicated to more than one of said orifices, the number of pressure chambers being fewer than the number of orifices.

8. The structure as recited in claim 1 wherein said transducer elastic means is in direct engagement with said piezoelectric members and is electrically conductive, said means for applying the voltage across said piezoelectric member including said transducer elastic means.

9. The structure as recited in claim 8 wherein said transducer elastic means is a web spanning said piezoelectric members.

10. In a liquid drop generator comprising: a housing having at least one pressure chamber therein, said pressure chamber opening onto an outer surface of said housing; elastic diaphragm means sealing said chamber opening thereby forming an outer wall thereof; driver unit means releasably secured to said housing, said driver unit means comprising a carrier member and at least one transducer means operatively secured to said carrier member; said transducer means comprising a piezoelectric member and elastic means operatively secured to said piezoelectric member for deforming therewith, the portion of said transducer elastic means corresponding to said piezoelectric member operatively engaging said diaphragm means in such a manner to normally exert a stress on said diaphragm means tending to decrease the volume of said chamber; and means for applying a voltage across said piezoelectric member to deform the same and thereby said transducer elastic means and diaphragm means for decreasing the volume of said chamber.

11. The structure as recited in claim 10 wherein said transducer elastic means is in direct engagement with said piezoelectric member and is electrically conductive, said means for applying the voltage across said piezoelectric member including said transducer elastic means.

* * * * *